United States Patent [19]

Nucci

[11] Patent Number: 5,614,819
[45] Date of Patent: Mar. 25, 1997

[54] MULTI-STATION MACHINE AND PRESS ASSEMBLY FOR ELECTRICALLY TESTING A PRINTED CIRCUIT BOARD HAVING MANUAL AND AUTOMATIC OPERATING MODES

[75] Inventor: Fernando Nucci, Arbizzano, Italy

[73] Assignee: Circuit Line S.p.A., Verona, Italy

[21] Appl. No.: 334,333

[22] Filed: Nov. 2, 1994

[30] Foreign Application Priority Data

Nov. 2, 1993 [IT] Italy .................... MI93A2323

[51] Int. Cl.$^6$ .................................. G01R 31/02
[52] U.S. Cl. .......................... 324/158.1; 324/758
[58] Field of Search ................ 324/158.1, 754, 324/73.1, 72.5, 758, 755; 439/482; 414/217, 225, 222

[56] References Cited

U.S. PATENT DOCUMENTS

| 3,970,934 | 7/1976 | Aksu | 324/72.5 |
| 4,471,298 | 9/1984 | Frohlich | 324/754 |
| 4,818,933 | 4/1989 | Kerschner et al. | 324/754 |
| 4,829,241 | 5/1989 | Maelzer | 324/754 |
| 5,094,584 | 3/1992 | Bullock | 324/754 |

FOREIGN PATENT DOCUMENTS

| 0263307 | 4/1988 | European Pat. Off. . |
| 0272450 | 6/1988 | European Pat. Off. . |
| 0305734 | 3/1989 | European Pat. Off. . |
| 8123096 | 6/1983 | France . |
| 2688975 | 9/1993 | France . |
| 8703044 | 5/1988 | Germany . |
| 2229540 | 9/1990 | United Kingdom . |

Primary Examiner—Vinh P. Nguyen
Attorney, Agent, or Firm—Sixbey, Friedman, Leedom & Ferguson, P.C.; David S. Safran

[57] ABSTRACT

A machine and relative press assembly for electrically testing a printed circuit board, including a frame (1) supporting a press with parallel planes, said press having a printed circuit loading area (3), a test area (4) and a parking area (5) for the upper head of the press, as well as a mechanism for moving said head (100) from the test area (4) to the parking area (5) and vice versa, to allow manual loading of the circuits to be tested directly in the test area (4) and a mechanism for moving the circuit boards from the loading area (3) to the test area (4) and vice versa, in the case of automatic or semi-automatic loading, thus creating two distinct work sections that can be used selectively by a single operator.

16 Claims, 11 Drawing Sheets

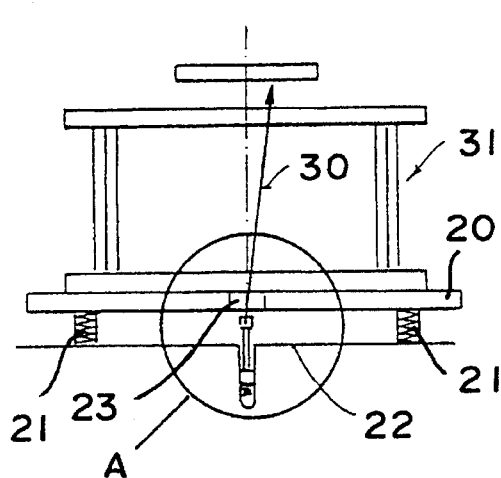
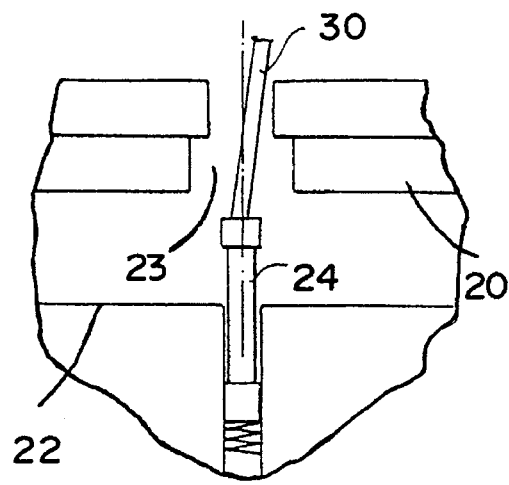
FIG. 18  FIG. 19
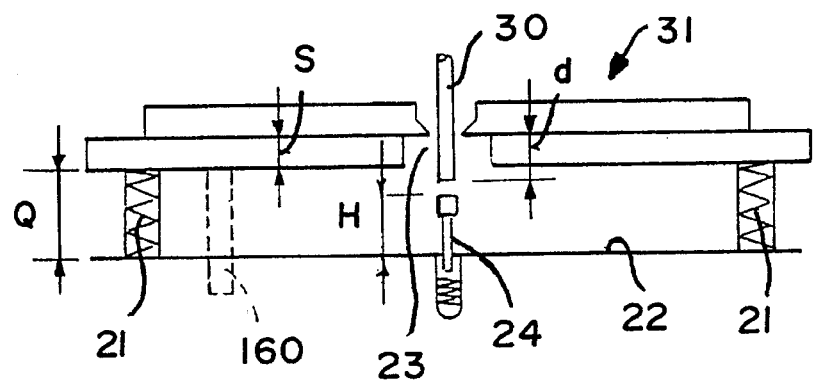
FIG. 20
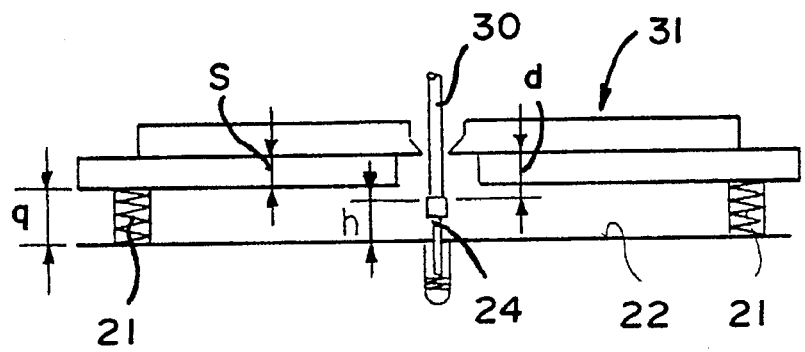
FIG. 21

MULTI-STATION MACHINE AND PRESS ASSEMBLY FOR ELECTRICALLY TESTING A PRINTED CIRCUIT BOARD HAVING MANUAL AND AUTOMATIC OPERATING MODES

DESCRIPTION

The present invention relates to a machine and relative press assembly for electrically testing at least one side of a printed circuit board.

As is known, the machines that allow electrical testing of printed circuit boards can be automatic or manual. Generally speaking, the automatic machines are composed of a press, which has a loading area and a test area, into which the board to be tested is transferred by a conveyor or carrier.

If carriers are used a mask has to be made on them for conveying the board, and consequently it is necessary to construct further elements, whose cost has to be added to that of the adapter which is always present in any case, this being the element that permits translation between the points of the board being tested and the fixed pitch electrical contact area provided at the level of the press with parallel surfaces.

This means that in many cases, for example when the number of boards to be tested is limited, the cost of the mask cannot be justified.

In these cases it is therefore advantageous to use manual machines, in which the operator manually positions the printed circuit board in the test area and operates the press to carry out the test.

During error identification, the possibility of operating directly on the test surface is an undeniable advantage in that it saves time and facilitates the work.

In other words, the automatic machines currently available on the market have considerable operating limits and are not versatile.

Another problem that is encountered with the solutions of the known art lies in the fact that a specific adapter must be used for each machine, since it is not possible to use various types of commercially available adapters on the machine, mainly because of the size differences between them.

The aim of the invention is to overcome the drawbacks described above, by providing a machine to carry out the electrical test on only one side of a printed circuit board, or simultaneously on both sides, which affords the possibility of obtaining two perfectly identical work stations, although the machine has only one operator.

A further aim of the invention is to allow the machine to be used with adapters of various types, thus constituting an open system for the adapters, without any need for particular modifications.

Yet another aim of the invention is to provide a test machine for printed circuit boards that is able to offer the fullest guarantees of reliability and safety in use.

The machine for performing the electrical test on at least one side of a printed circuit board according to the invention has the characteristics described in the appended claims. In particular the machine comprises a frame supporting a press with parallel surfaces, said frame having a loading area, a test area and a press head parking area. In addition, means are provided for moving the head from the test area to the parking area, in order to create two distinct workstations, that can be used selectively by a single operator.

Further characteristics and advantages of the invention will be made clearer on examination of the description of a preferred, but not exclusive embodiment of a machine for electrically testing a printed circuit board, illustrated by way of non-limiting example with the aid of the appended drawings, in which.

Figure 7:
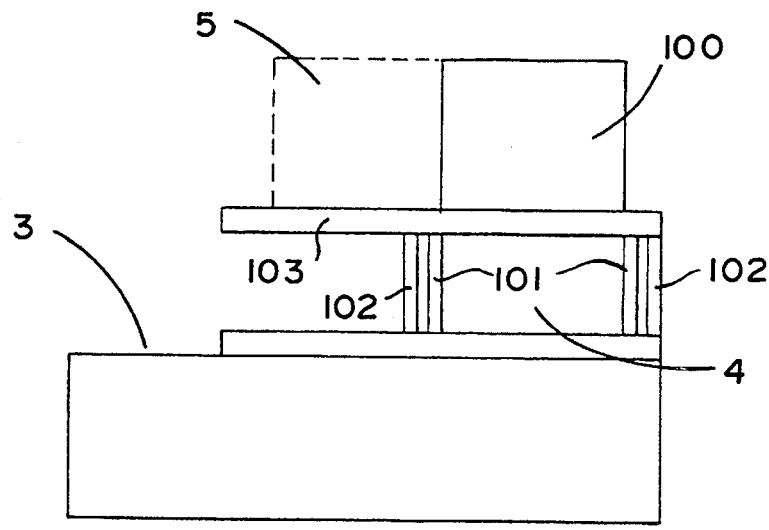
Figure 8:
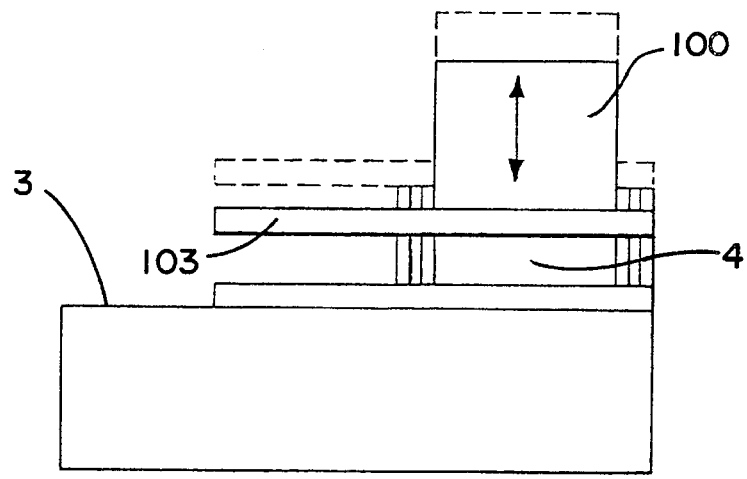
Figure 9:
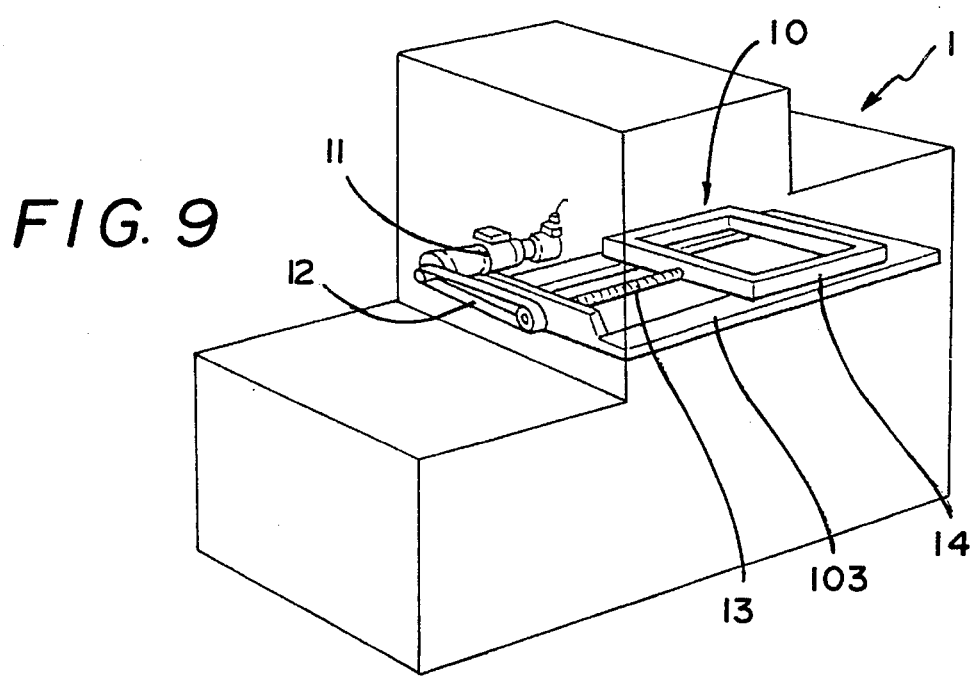
Figure 10:
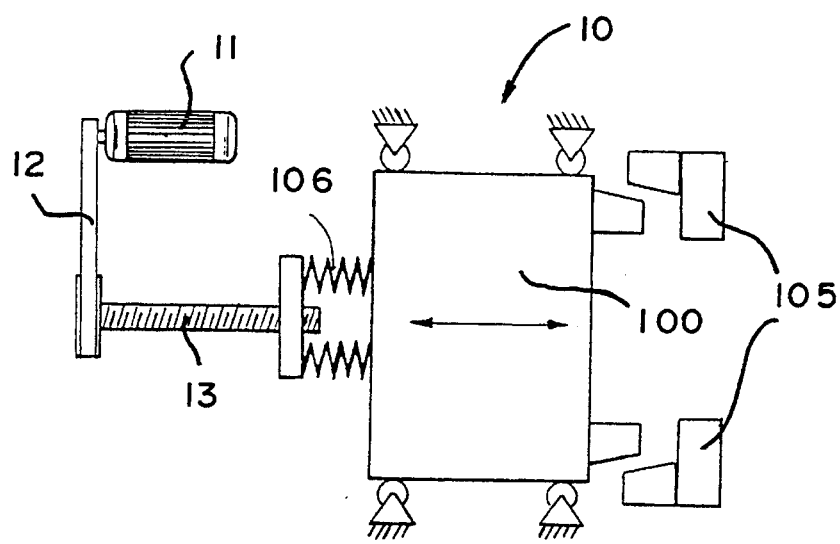
Figure 11:
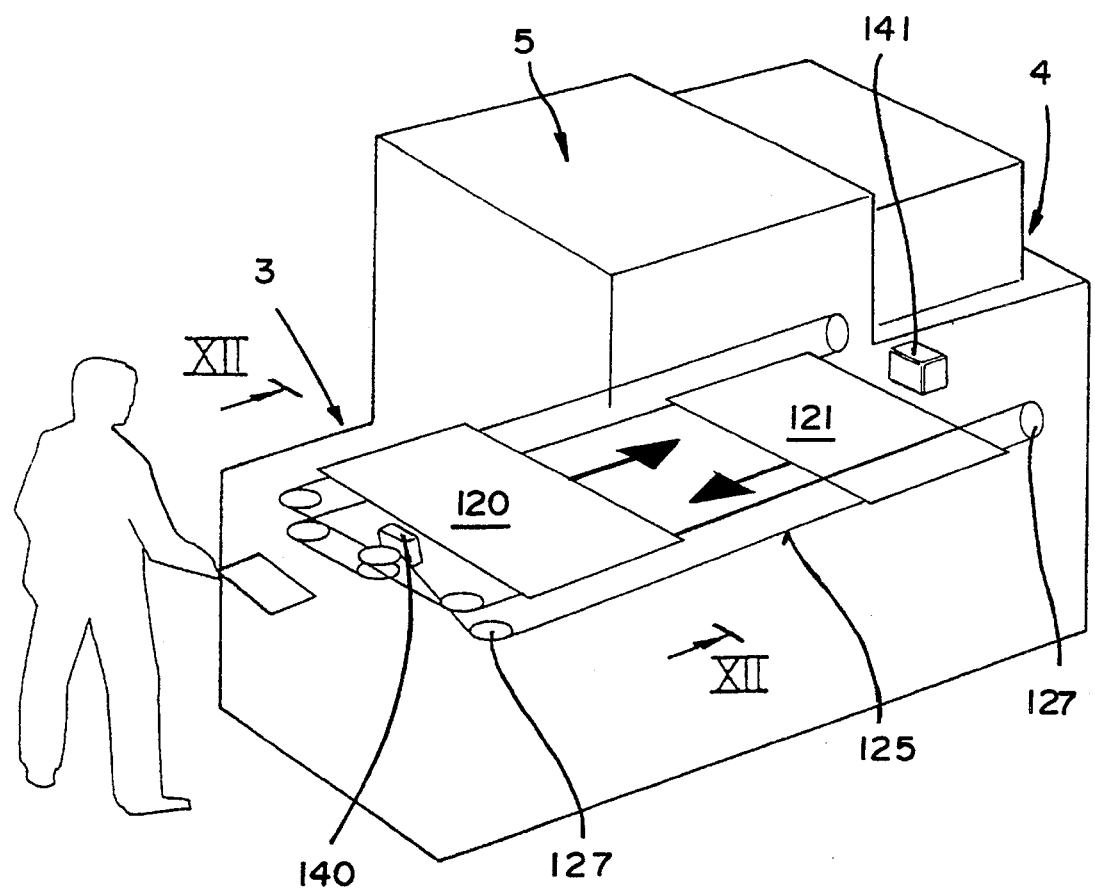
Figure 12:
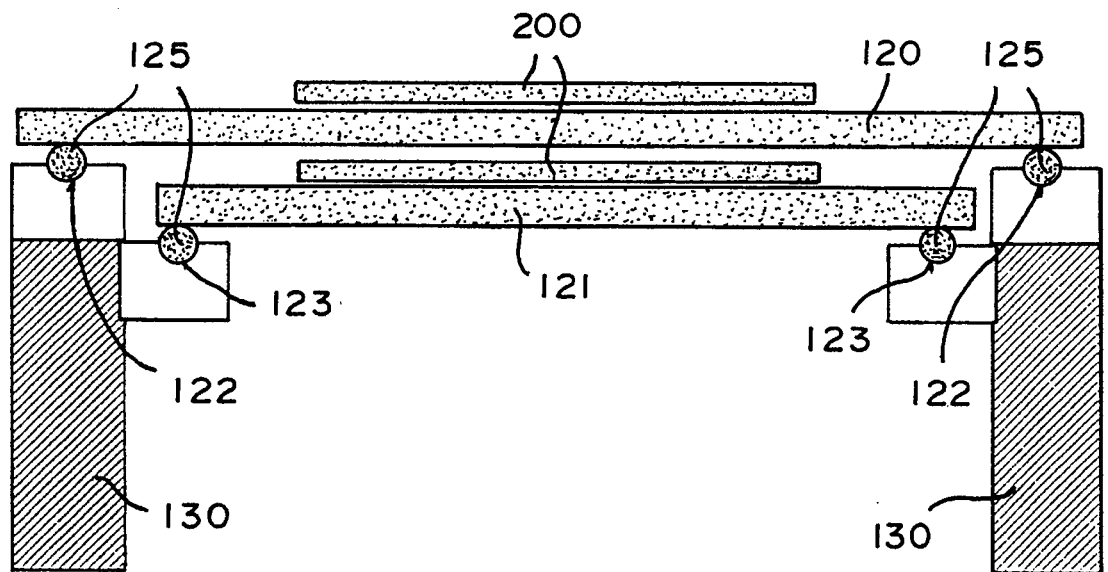
Figure 13A:
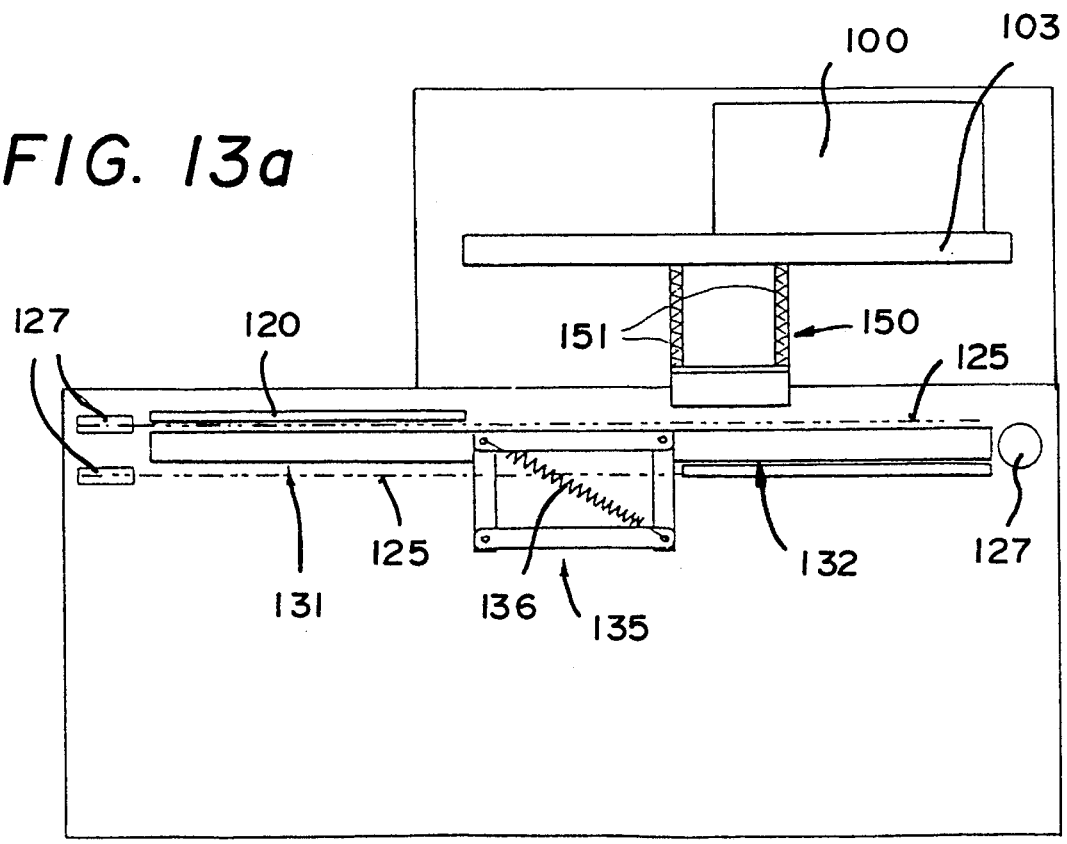
Figure 13B:
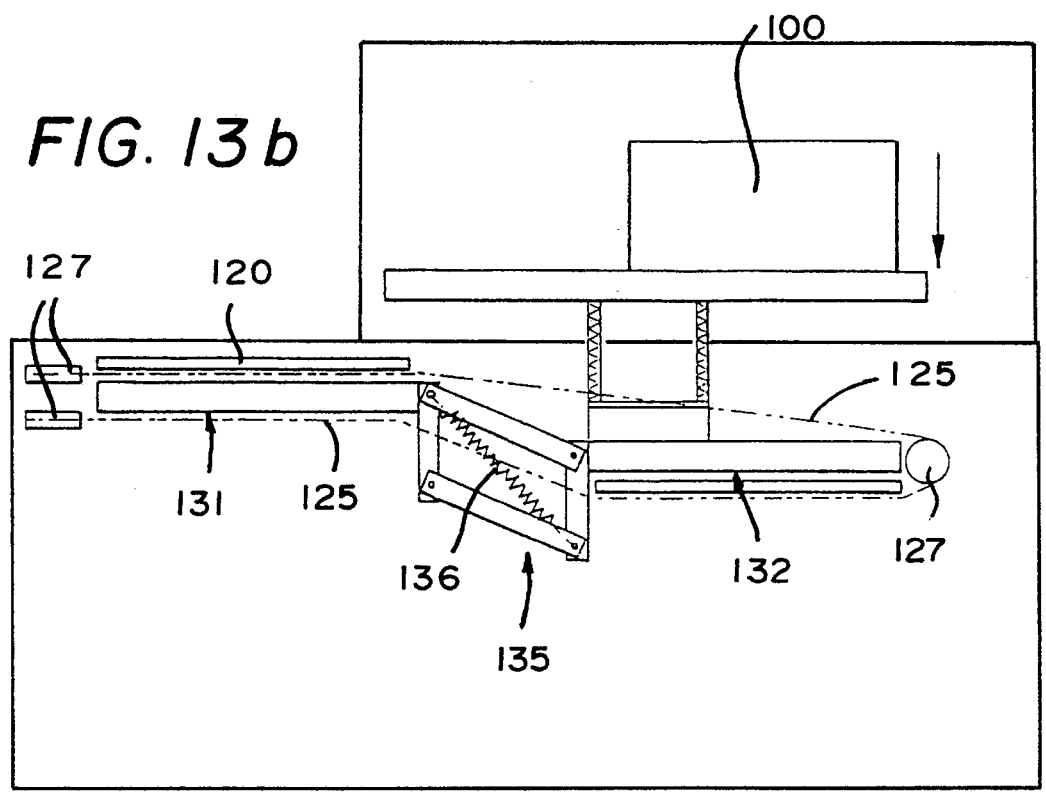
Figure 13C:
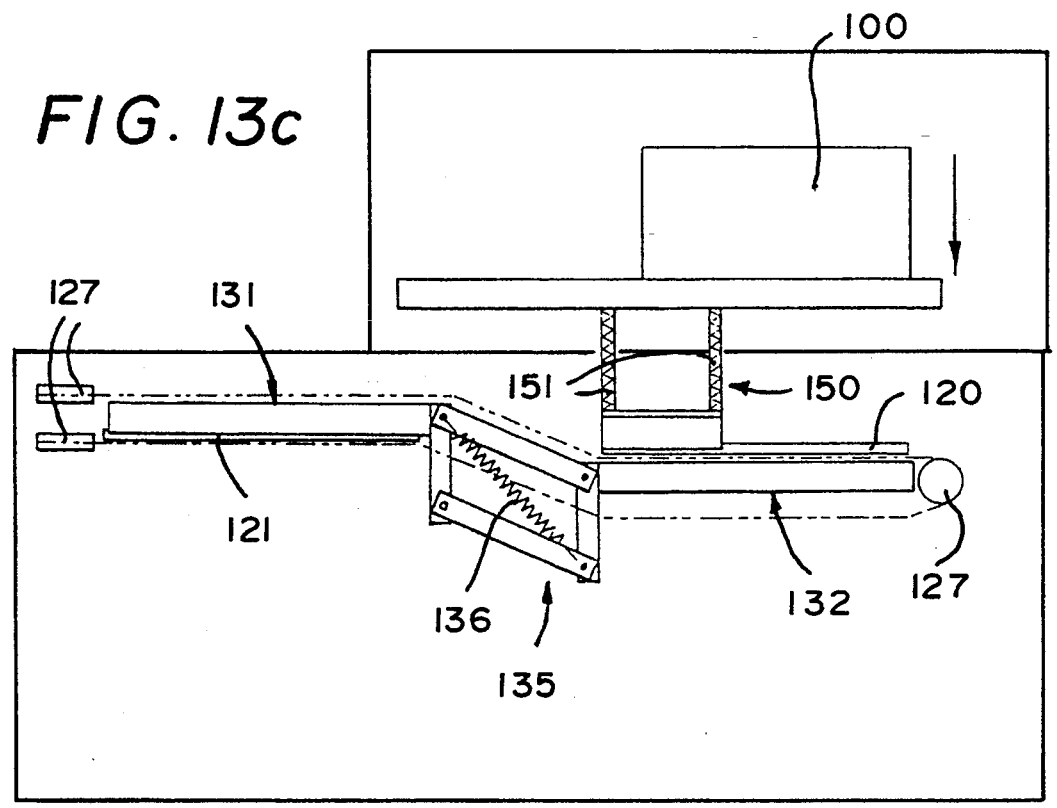
Figure 22:
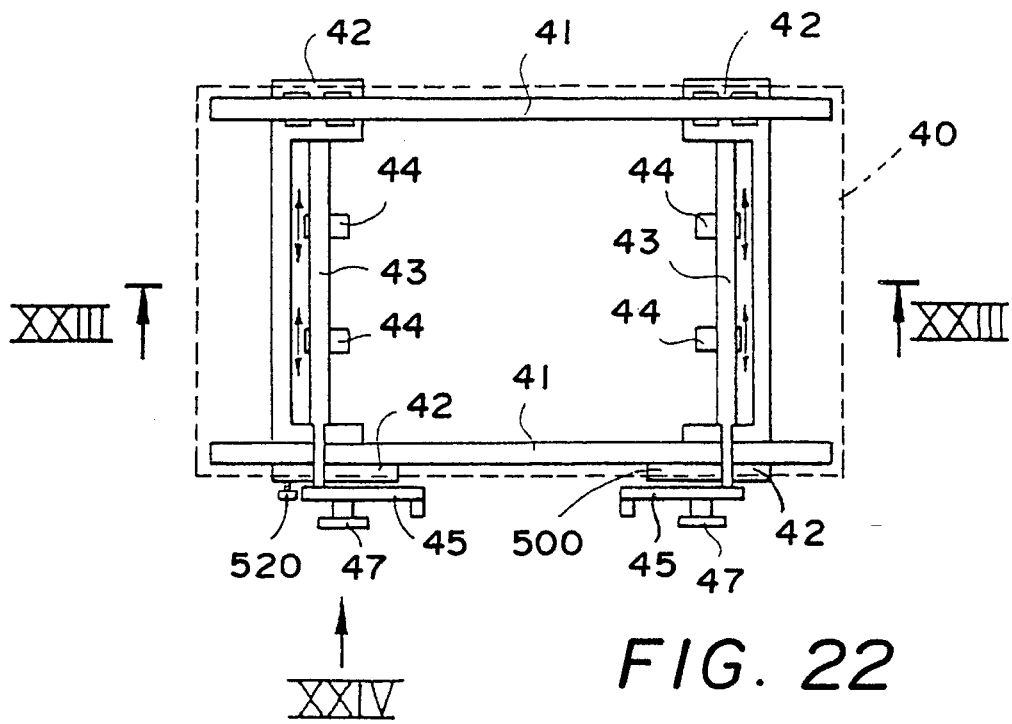
Figure 23:
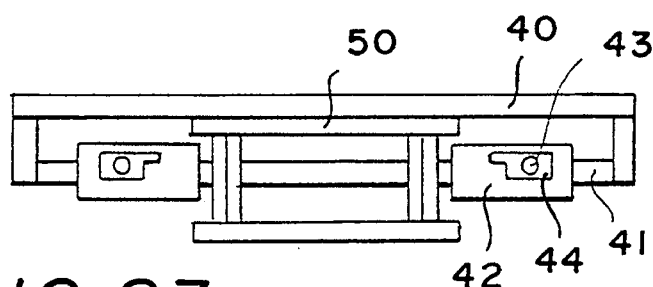
Figure 24:
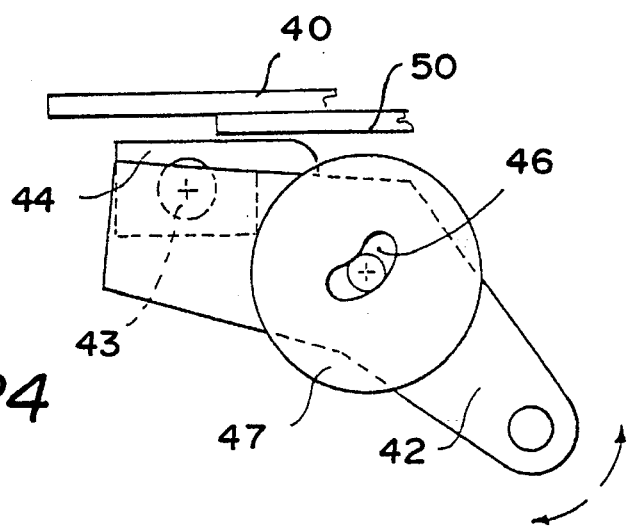

FIGS. 3, 4, 5 and 6 schematically illustrate, in sequence, use of the machine directly from the test area, showing the movement of the upper electrical testing head;

FIGS. 7 and 8 are schematic side elevation views of the machine, showing the movements of the upper head of the press assembly;

FIG. 9 shows schematically the means for moving the upper head;

FIG. 10 shows the same means as in FIG. 9 in a plan block diagram;

FIG. 11 shows schematically the use of the machine set up for automatic testing, with loading of the circuits on carriers;

FIG. 12 is a schematic cross section of the carrier handling system, taken for example along the line XII—XII in FIG. 11;

FIGS. 13a, 13b and 13c are schematic views in longitudinal section showing, respectively, handling of the carriers, lowering of the section of mobile rail to bring the lower carrier and the upper carrier, respectively, into the test position;

FIGS. 14, 15, 16 and 17 are schematic cross sections taken in the test area of the machine, showing a sequence of stages during testing of a printed circuit board positioned on the lower carrier;

FIG. 18 shows the supporting device of a lower adapter;

FIG. 19 is an enlarged illustration of the detail A in FIG. 8,

FIGS. 20 and 21 show the detail of the supporting device of the lower adapter in the resting and testing state, respectively, FIG. 22 is a schematic plan view of the support device for an upper adapter;

FIG. 23 is a view along the line XXIII—XXIII in FIG. 22, also showing an adapter;

FIG. 24 is a view in the direction of the arrow XXIV in FIG. 22.

With particular reference to the numerical symbols in the above figures, a machine for carrying out the simultaneous electrical test on both sides of a printed circuit board is illustrated and described but clearly the same machine can be used to test just one side of the board. Such a machine comprises a frame, indicated as a whole by reference number 1, which supports a press 2 with parallel surfaces, which preferably has a stroke of 400 mm.

The frame 1 has a loading area 3, a test area 4 and a parking area 5 of the press head 100.

The loading area 3 is advantageously situated at one end of the machine, to facilitate the incoming flow of the boards to be tested and so as to be directly accessible to an operator, whether automatic or manual.

The test area 4 may be situated in the center, to reduce transport time, but in this case it is poorly accessible if the apparatus is used without a carrier, with manual loading of the boards.

The test area 4 is preferably positioned on the opposite side to the loading side, thus making the test area more accessible for manual operations.

It is clear, however, that other arrangements are possible besides the one illustrated.

With the arrangement shown in the appended figures, therefore, it is possible to pass without any modifications from use of the machine with a carrier to operation of the machine directly on the adapter, placed in the test area.

The workstation can be varied extremely easily, in that the control terminal, indicated by 7 (FIG. 3), can easily be moved from one workstation to the other.

Alternatively, two mutually exclusive terminals 7 could be used, each positioned in a respective work station 3 or 4.

In the case of operation of the machine with manual loading, as shown in FIGS. 3 to 6, the operator positions the piece for testing directly on the adapter, in the test area 4, as will be better described below.

This is facilitated by the fact that the head 100, besides moving vertically, on columns 101 (see also FIGS. 7 and 8), by means of vertical screws (102), withdraws to the parking area 5 towards the center of the machine (FIG. 3), sliding horizontally on longitudinal guide members 103, as will be better described below.

Figure 4:
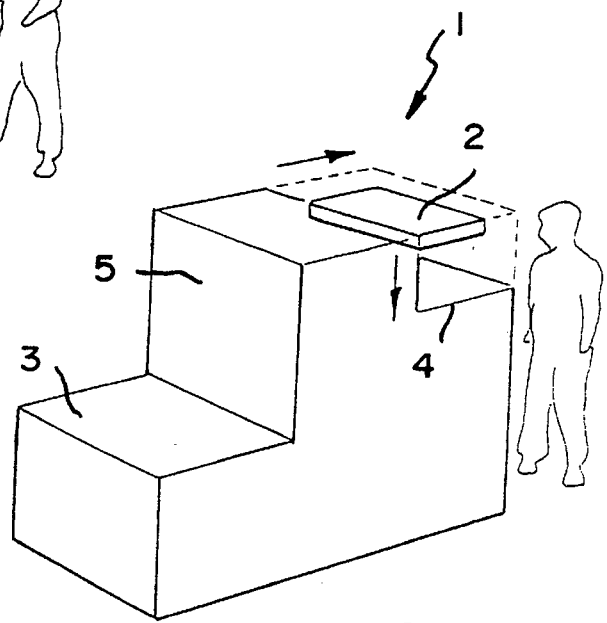
Figure 5:
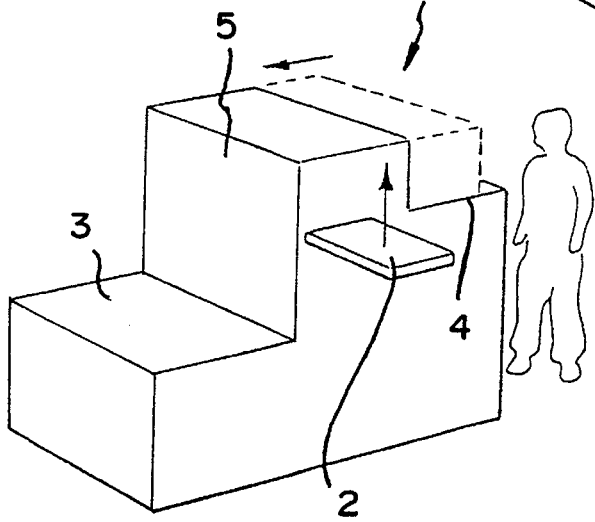

Subsequently, when the operator presses a double pushbutton control, the test area is closed, with the return to the closed position of the upper head 100, and the press is closed (FIG. 4).

Figure 6:
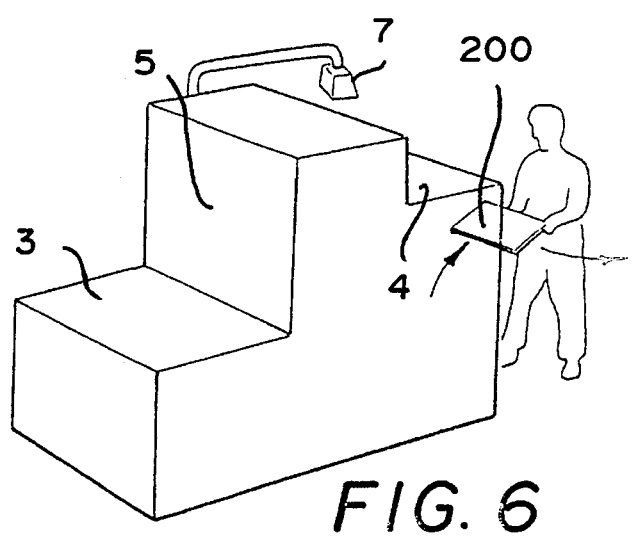

At the end, again on a double-push-button command by the operator, the press is opened (FIG. 5) and the upper head moves to the parking area, thus allowing the operator to replace the piece and start a new cycle (FIG. 6).

The test data are provided by machine terminal 7.

To effect opening of the upper head 100, that is the horizontal translation movement, opening means are provided which are shown more clearly in FIG. 9 and in the diagram in FIG. 10 and are indicated as a whole by reference number 10. Said opening means comprise a continuous current electric motor 11, with position control, which, by means of toothed belts 12, acts on a threaded rod system 13, that operates a mobile frame 14.

The presence of a continuous current motor with position control allows the degree of opening value to be adjusted, in order to optimize the stroke and reduce testing time.

For correct positioning of the upper head 100 in the test area 4, a system of rigid mechanical stops 105 is provided, disposed on longitudinal members 103 as shown in the diagram in FIG. 10, against which the head 100 abuts. A spring cartridge 106 is interposed to avoid dangerous load conditions of the motor 11.

Obviously other means are possible for opening of the upper head 100, which may, for example, take place with rotation about a fulcrum of the upper head or, preferably, with rotary translation of the upper head itself.

Alternatively, a press stroke exceeding one meter could be foreseen, in order to allow good access to the electrical contact area, without having any horizontal head movement and, in practice, creating a parking area positioned above the test area 4.

In the case of operation of the machine with automatic, or rather semi-automatic, loading, as shown in FIGS. 11–13c, a system of two carriers 120, 121 is used to carry the circuits for testing from the loading area 3 inside the press, or test area 4. Such carriers 120, 121 have a perforated support for passage of the test needles. The two carriers move on parallel planes one above the other. They always move in opposite stokes: when one carrier is in the test position the other is in the loading position.

Figure 1:
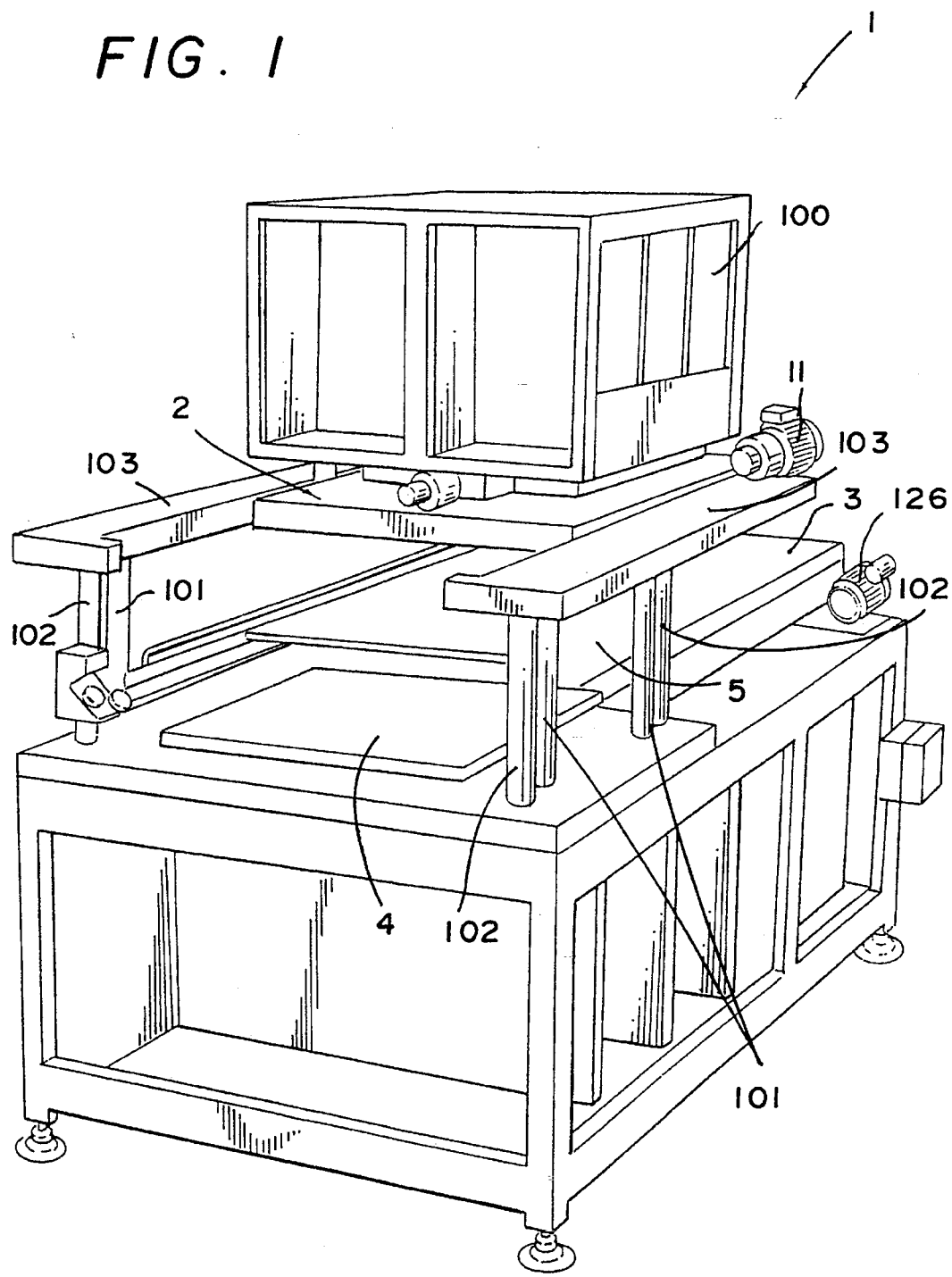
FIG. 1 is a schematic perspective view of the machine seen from the test area side.
Figure 2:
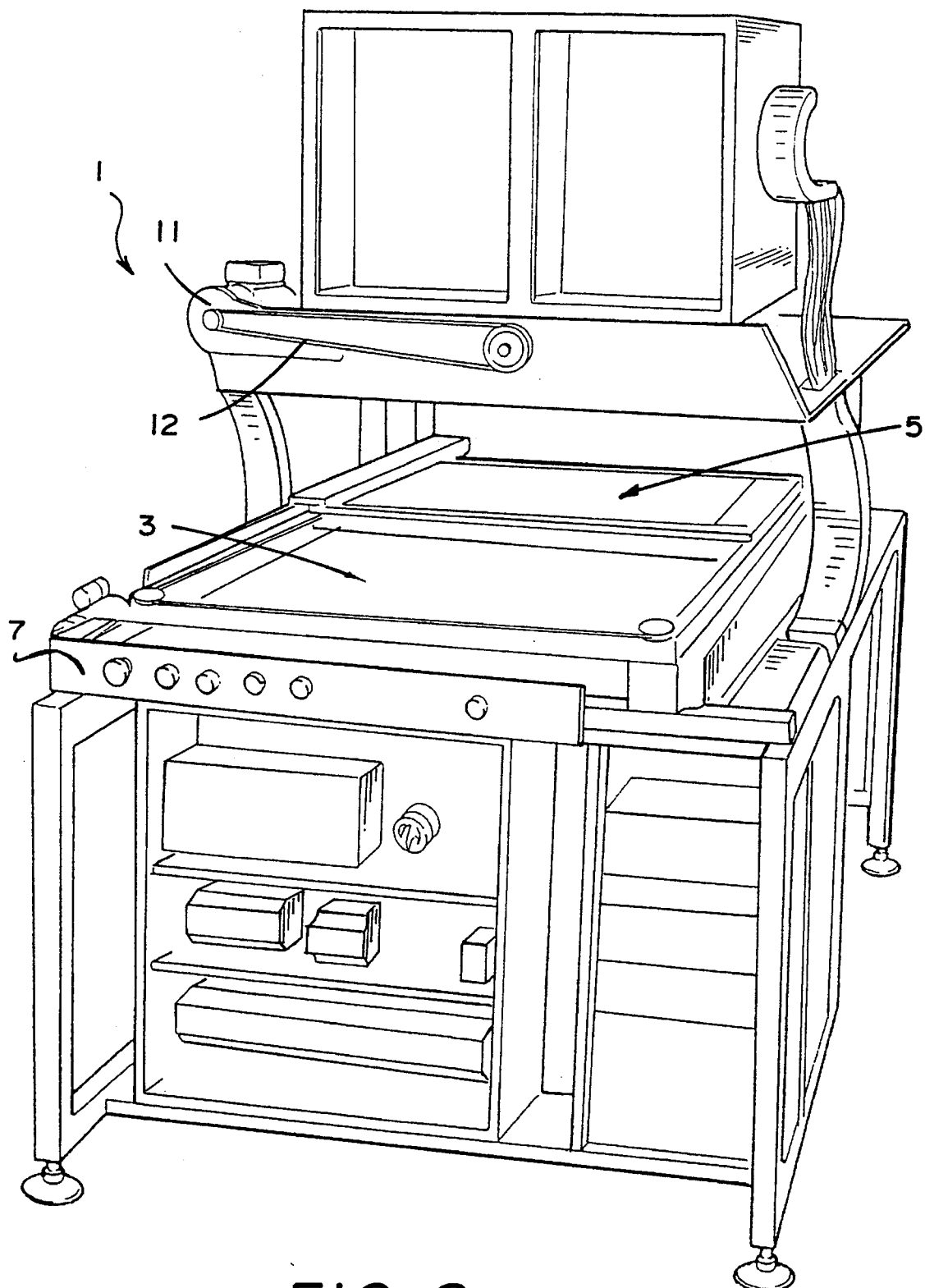
FIG. 2 is a schematic perspective view of the machine seen from the other side, i.e. from the loading area.
Figure 3:
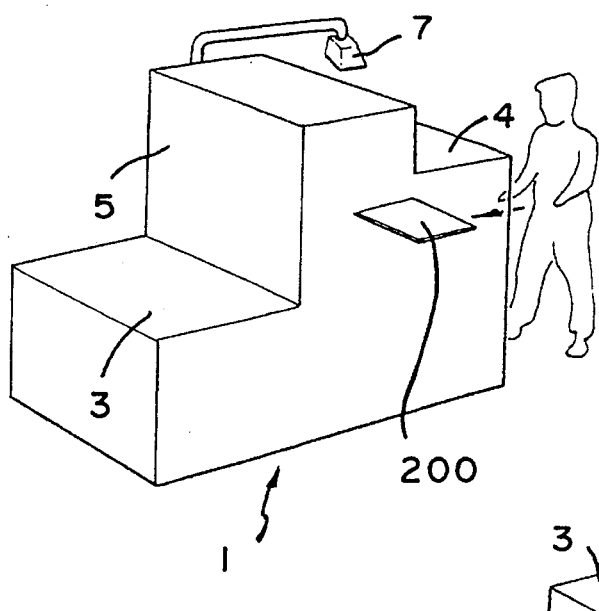

The system that allows movement of the carriers 120, 121 is made up of two rails 130, each carrying two staggered seats 122 and 123 one on top of the other in which endless elastic belts indicated as a whole by 125 run, moved by an electric motor 126 (FIG. 1). On the rails 130 there is a series of pulleys 127 that allow the movement of the belts.

The carriers receive traction from the belts by simple friction, not being in any way constrained to them for reasons of operator safety.

Each rail 130 guides an endless belt on the seats 122, 123 from the loading area 3 to the test area 4, and is divided into two sections 131, 132: section 132 is in the test area 4 and follows the vertical movement of the head 100 to allow the carrier 120 or 121 to position the printed circuit 200 on the lower test apparatus, whilst the section 131 that is situated in the loading area remains at a constant height to allow the circuits to be loaded and unloaded from the carriers.

The height of the entire carrier handling system, that is the system of rails 130 and elastic belts 125, can in turn be adjusted to allow the machine to adapt to test apparatus of different sizes, as will be better explained below.

The rail section 132 that is situated in the test area 4 is constrained to the section 131 of the loading zone by means of an articulated parallelogram mechanical system (135) that ensures that the two rail sections 131, 132 are maintained parallel to each other even when the test area section 132 moves vertically to follow the head 100. The alignment of the two sections is ensured by special mechanical stops and by the force provided by a pre-loaded spring 136.

From FIGS. 13a–13c it can be noted that the use of elastic belts 125 makes it possible to follow the change in the center distance between the terminal pulleys resulting from the rotation of the parallelogram 135, without any need for systems to provide or take up tension. The correct working tension of the belt is obtained by adjusting the length of the belt itself:

The correct position of the carrier 120 or 121 both in the loading area and in the test area, is determined by the respective mechanical stops 140, 141 (FIG. 11). Each mechanical stop has a sensor to detect the presence of the carrier in the correct position. The machine checks that the sensors are both active before stopping the belt drive motor. In the fleeting interval of time necessary for the sensors to be activated simultaneously, the elastic belts slide on the carrier which is already positioned against the mechanical stops; this is possible because there is no constraint between the belts and the carriers.

Connected to the upper head 100 there is a pressure device 150 which comes into contact with the structure of the mobile rail 132 to cause it to move: the height of said device 150 can in turn be adjusted by means of a screw system 151 (see also FIGS. 14–17) to accommodate different sizes of upper test apparatus on the machine.

With reference to FIGS. 14 to 17, the stages of testing a printed circuit indicated by reference number 200 will now be described briefly.

In these figures the printed circuit 200 is positioned on the lower carrier 121, and the test is to take place simultaneously, both on the lower side and on the tipper side, but clearly it would make no difference if the printed circuit 200 were placed on the upper carrier 120 or directly on the lower test apparatus, in the case of manual loading, in which the carriers 120 and 121 are removed from the machine.

It is also obvious that the test can be carded out only on the lower side of the printed circuit 200, in which case the upper test apparatus is missing.

In FIGS. 14 to 17 the means that allow the machine to operate with adapters of different types are illustrated and will be described below.

These figures are schematic cross-sections taken in the test area 4 of the machine.

Figure 14:
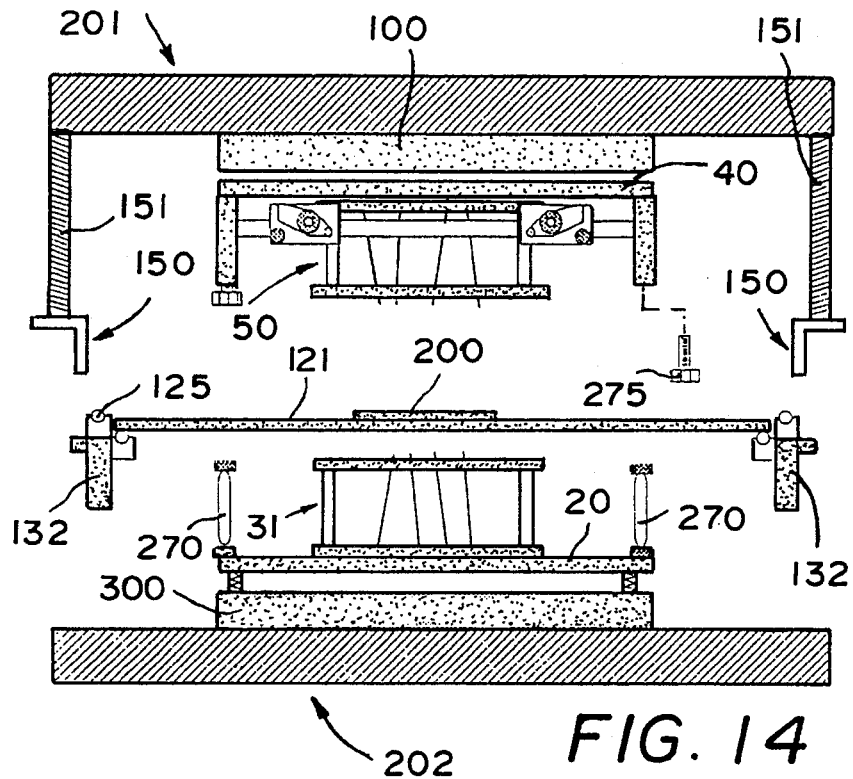

FIG. 14 corresponds to the position in which the carrier 121, which conveys the circuit 200, is halted through the effect of the mechanical stop 141 and the upper part of the press, indicated as a whole by the reference number 201, is about to start its descent, the lower part being indicated by reference number 202.

Figure 15:
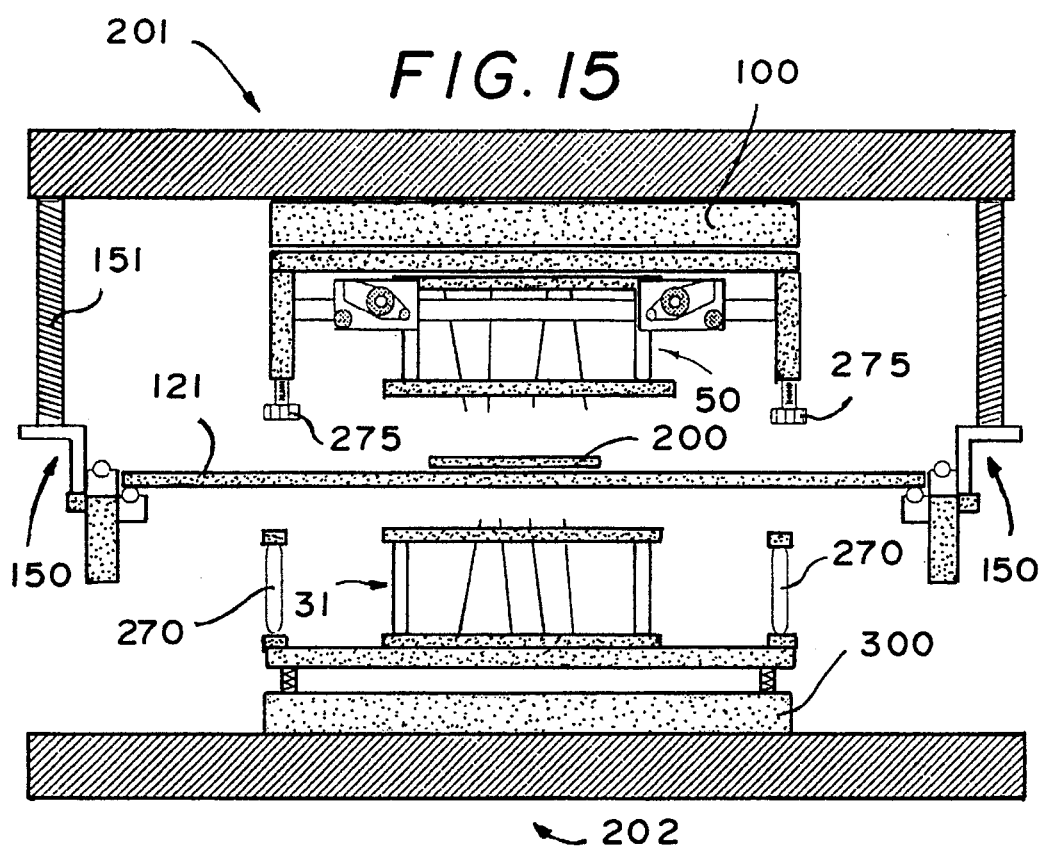

FIG. 15 shows the position in which, as a result of the vertical downward movement of the upper part 201 of the press, the pressure system 150 comes into contact with the mobile section 132 of the guide rails 130 of the elastic belts 125 that convey the carriers.

Figure 16:
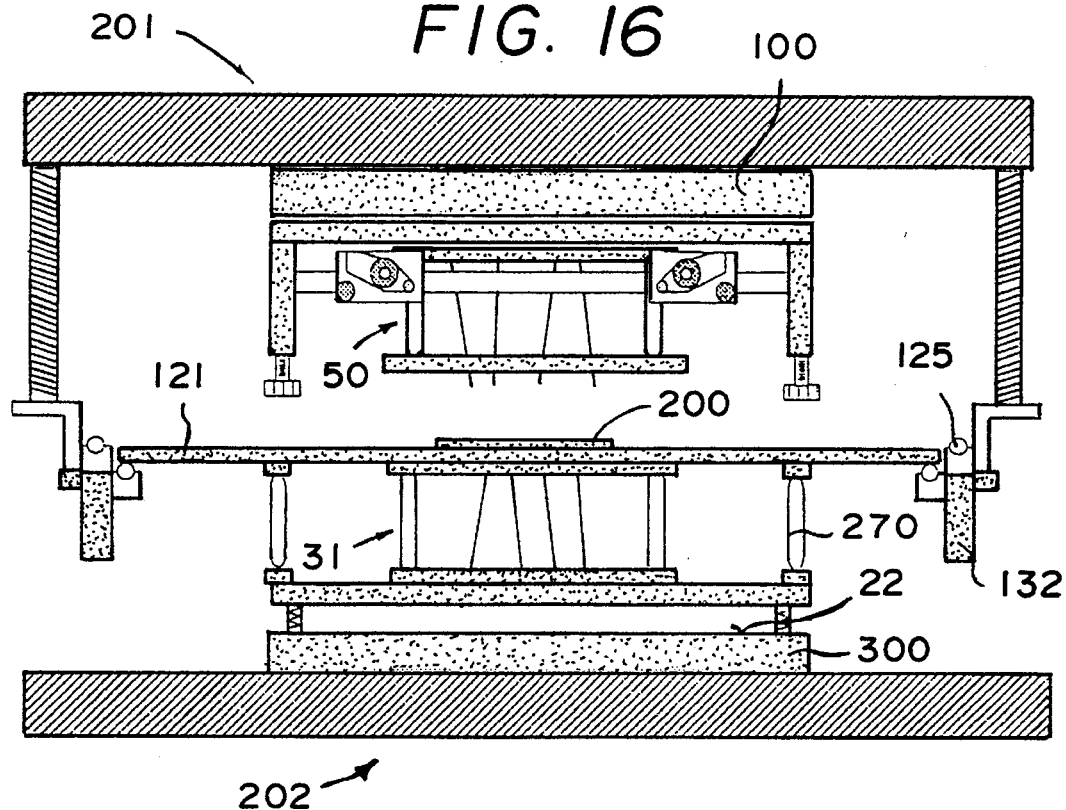

FIG. 16 shows the machine set-up at the moment when, as a result of the vertical movement of the press, the pressure system 150 lowers the mobile section 132 of the rails 130, bringing the carrier 121 into contact with the lower test adapter, allowing the circuit to come into contact with the centering devices of the adapter itself.

Figure 17:
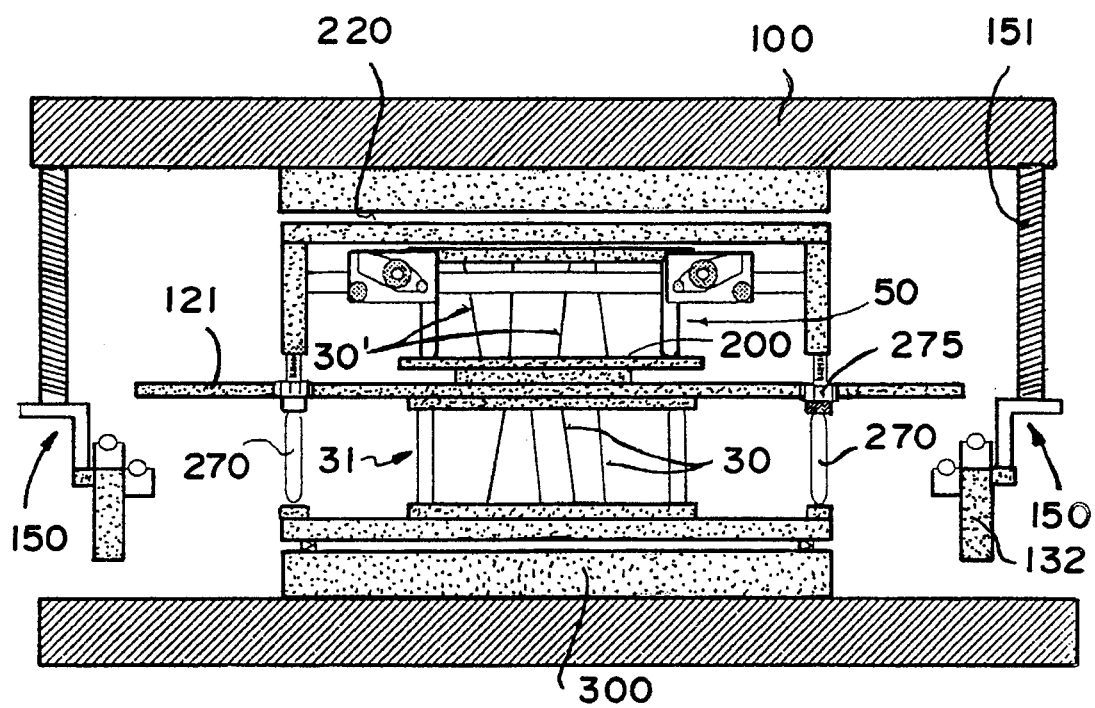

FIG. 17 shows the machine set-up in the position in which the vertical movement of the upper part 201 of the press stops and the electrical test is carried out on the circuit 200. In this position the pressure system 150 has lowered the mobile section 132 of the rails 130 to a lower height than that of the carrier 121, deposited together with the circuit 200 on the lower adapter 31, which will be recalled below.

As is known, the test consists of checking that all the nets present on the printed circuit board 200 are insulated from each other and that there is electrical continuity between the points in each net. This is done by means of electrical contacts with well defined points in the circuit.

For this purpose, a constant gauge grid, or needle bed, is used for each side of the circuit board to be tested, comprising a plurality of elastic electrical contacts, and a translation element or adapter, in which a number of needle contacts or pins corresponding to the number of points to be tested on the electrical circuit is arranged, said pins establishing an electrical connection between the corresponding needles in the grid and the points in the printed circuit 200.

In the attached FIGS. from 14 to 17, the lower grid or needle bed 22 is disposed in the lower head 300 of the press, and the lower adapter 31 cooperates with it, as will be described shortly.

The upper grid or needle bed 220, on the other hand, is disposed in the upper head 100 of the press, and the upper adapter 50 cooperates with it.

According to the invention, provision is made for the circuit testing press assembly to accommodate various types of adapters 31 or 50.

With reference firstly to the lower part 202 of the press, on referring to FIGS. 18 to 21 it will be noted that in order to allow the adapter 31 to be installed on the machine, it must be supported elastically so that the needles 30 do not compress the spring contacts 24 of the grid 22 and the grid itself can activate press stroke control sensors 160, which are normally at the four corners of the grid 22, only one of which is shown schematically in FIG. 20; in addition, the right pressure must be exerted on the elastic means, in relation to the distance d (positive or negative) by which the adapter needles protrude towards the grid.

To achieve these aims, use is made of a sheet 20 of insulating material, preferably made of a fiberglass and epoxy resin laminate.

The external dimensions of the sheet 20 must be sufficient to rest on supporting springs 21 provided on the edge of the contact grid 22; the sheet 20 has through holes 23 for the free passage of the spring contact elements 24 of the grid.

The adapter 31 is set down on the sheet 20 and positioned by means of centering pins which engage in special holes provided both on the adapter and on the sheet.

The test needles 30 that protrude from the lower side of the adapter 31 enter the holes 23 in the sheet 20 to come into contact with the grid 22 below.

To avoid having to change the setting of the press stopping device when the type of adapter in use changes, the thickness S of the sheet on which the press stopping sensors 160 act must be chosen so as to be the same as the height h, during compression, of the spring contact 24 of the grid 22, plus the distance d by which the test needles 30 protrude from the lower side of the adapter, less the press stopping height q. Hence the relation S=h+d−q.

The thickness S of the sheet 20, added to the height of the sheet from the grid base 22 when resting Q and less the amount d by which the test needles protrude, must be greater than the resting height H of the spring contact 24 of the grid (S+q−d>H) so that, when resting, the needles 30 do not rest on the spring contacts 24.

This system allows the lower adapter 31, which is smaller at its perimeter than the sheet 20, to be placed in a generic position; during the test, the sheet 20 varies its distance from the test grid, compressing the supporting springs 21 on the grid perimeter, thanks to the pressure exerted by the adapter.

If the resultant of the elastic reactions of the perimeter springs 21 of the grid does not coincide with the resultant of the pressures exerted by the adapter, the sheet 20 is disposed so that it is not parallel to the plane of the test grid.

Under the action of the system of forces previously described, the sheet 20 can buckle; the possible buckling, in addition to the fact that the sheet and the grid are not parallel, could cause errors in control of the press movements.

To limit these errors, distance pieces can be installed on the sheet 20, at the four corners.

The thickness of these distance pieces 270, shown in FIGS. 20–23, must be such that the upper part 201 of the press, namely the part of the test system that exerts pressure on the sheet 20 and adapter 31 system, contacts the circuit 200 being tested and the distance pieces 270 simultaneously.

Thus the edge of the sheet 20 and the adapter 31 are forced to move in an identical manner.

This is achieved, as can be seen in FIG. 23 in particular, by providing knurled screws 275 at the support system for the upper adapter 50, that come into contact with the tops of the distance pieces 270.

The screws 275 are adjusted to compensate for the thickness of the printed circuit board 200 being tested.

In the case of adapters 50 for testing the upper side of the circuit 200, besides what has already been seen for the lower adapter 31, as shown in FIGS. 20–23, the problem must also be overcome of supporting the adapter, whatever its dimensions, within the working area of the machine.

The supporting device, which allows a generic adapter 50 to be suspended from the upper test grid 220, comprises a sheet 40, identical to the lower sheet 20, of insulating material equipped with through holes according to a grid identical to the test grid, to which two metal rods 41 are fixed, on the two opposite sides to the board itself.

The above mentioned rods serve as a guide for two slides 42, each of which supports a cross rod 43, to which are connected blocks 44 which can slide, but not rotate, with respect to the rod 43.

The rod 43 can rotate around its own longitudinal axis and ends in an external crank 45 integral with one end of the rod 43 and equipped, in a median portion, with a slot 46, shaped like a portion of circumference, in which a locking handle 47 screws to fix the angular position of the rod 43.

The operating principle is as follows: the adapter 50 is positioned in contact with the plate 40, while the two slides 42 are brought to the outermost open positions possible.

The crank 45 is then operated, positioning the two slides so that the flanges, or edges, of the blocks 44 are inserted beneath the edge of the plate 50 of the adapter; if necessary, the position of the blocks along the rod 43 should be adjusted so that their flanges can be inserted beneath the edge of the adapter plate 50.

By means of the crank 45, the rod 43 is rotated so that the flanges of the blocks 44 exert pressure on the plate 50, towards the plate 40.

Once the positioning is completed, the threaded locking handle is tightened, so that the crank 45 is locked by friction against the sliding shoe 500 of the slide 42.

In this manner, the crank 45 being rigidly connected to the rod 43 since the blocks 44 cannot rotate with respect to the rod, the adapter is supported and rigidly constrained to the plate 40.

The plate 40 is of a thickness calculated so that at the end of the press movement the test needles 30' exert the correct compression on the spring contacts of the upper grid.

Since the adapters are reciprocally positioned, through the use of reference pins, one of the two must be allowed a certain freedom of movement.

Therefore, the plate 40 can be constrained to the upper grid 220, with supports that hold it at a suitable distance from the test grid, and is positioned with respect to it by means of reference pins that engage in holes with a certain play, preferably 0.3 mm.

In this manner, when, because of the movement of the press, the upper adapter/support device assembly comes to rest on the lower adapter, closing the circuit 200 (FIG. 17), before the upper test grid enters into contact with the plate 40, reciprocal centering of the adapters can take place.

To favour this possibility of reciprocal centering of the adapters, it is possible to roughly position the upper adapter with respect to the plate 40, by means of two pins installed on the plate 40 which engage in the holes provided for this purpose on the adapter plate.

The diameter of the two holes is about 0.3 mm larger than that of the two pins, so that the adapter is free to move with respect to the plate 40.

In order to exploit this freedom of movement, the support system has to be positioned with the flanges of the blocks 44 under the edge of the adapter plate, without turning the crank 45 upwards, in order to block the plate 50 against the plate 40.

The size of the crank 45 is such that if the threaded handle 47 is not tightened, the flanges of the blocks 44 remain horizontal, preventing the adapter from falling. The slides 42 are locked in this position by means of a screw 520, provided on the slides 42, which tightens against the rods 41.

From what is described above, it can be seen that the invention achieves the proposed aims.

In particular, it should be stressed that the machine thus realized allows two different workstations to be created, accessible to a single operator, obtaining an extremely versatile machine and the possibility of working either with or without a carrier.

Another important aspect lies in the fact that it is possible to use adapters of various makes, with simple and rapid adaptation to the apparatus.

The invention, thus conceived, lends itself to numerous variants and modifications, all coming within the scope of the concept of the invention.

Moreover, the materials employed, provided they are compatible with the specific use, and the dimensions and contingent shapes can be of any kind, according to requirements.

I claim:

1. A machine for electrically testing at least one side of a printed circuit board, comprising a frame supporting a press with parallel surfaces, that acts on the circuit board to carry out a test on it, wherein said frame has an automatic loading area, a test area and a parking area for a press head, means provided on said frame for moving said press head from the test area to the parking area and vice versa to allow manual loading of the circuit boards in the test area which thereby forms a manual loading area, and means provided on said frame for automatically transferring the circuit boards from the automatic loading area to the test area and vice versa, thus creating two distinct work stations that can be used selectively by a single operator, said work stations being a manually loaded work station provided at said test area and an automatic automatic loading work station provided at said loading area, and wherein a control terminal is provided with which testing of the circuit boards can be performed at each of said work stations by a single operator.

2. A machine according to claim 1, wherein said loading area and said test area are situated at opposite ends of said frame, while said parking area is situated in a central part of the frame.

3. A machine according to claim 2, wherein said means for moving the head from the test area to the parking area and vice versa operate by translation and comprise a linear actuator that acts on the head through interposition of a spring cartridge, mechanical stops being provided to halt the head in the test position.

4. A machine according to claim 3, wherein said means for transferring the primed circuit boards from the loading area to the test area and vice versa comprise a pair of rails on which the circuit boards travel in opposite directions moving on two parallel planes, one above the other, so that while one circuit is transferred to the test area, another circuit board that has already been tested is transferred to the loading area.

5. A machine according to claim 1, wherein said parking area is situated in a raised position with respect to said test area.

6. A machine according to claim 1, wherein said means for moving the head from the test area to the packing area and vice versa operate by translation and comprise a linear actuator that acts on the head through interposition of a spring cartridge, mechanical stops being provided to halt the head in the test position.

7. A machine according to claim 1, wherein said head is vertically movable on columns.

8. A machine according to claim 1, wherein said means for transferring the primed circuit boards from the loading area to the test area and vice versa comprise a pair of rails on which the circuit boards travel in opposite directions moving on two parallel planes, one above the other, so that while one circuit is transferred to the test area, another circuit board that has already been tested is transferred to the loading area.

9. A machine according to claim 8, wherein an elastic belt conveyor system on which carriers for supporting the respective printed boards rest without any constraint are disposed one above the other accommodated and guide by said rails, stops being provided to halt the carriers in the loading area and the test area, respectively.

10. A machine according to claim 9, wherein said rails are of an adjustable height and they comprise a fixed section in the loading area and a vertically mobile section in the test area, the two sections (131, 132) being connected to each other by means of an articulated parallelogram (135) that ensures that they are parallel.

11. A machine according to claim 8, wherein said rails are of an adjustable height and they comprise a fixed section in the loading area and a vertically mobile section in the test area, the two sections (131, 132) being connected to each other by means of an articulated parallelogram (135) that ensures that they are parallel.

12. A machine according to claim 11, wherein said vertically mobile section (132) of the rail (130) is operated by a pressure element that is adjustable on screws and is integral with the upper head of the press.

13. A machine according to claim 1, wherein said press is formed of a press assembly comprising an upper part and a lower part, between which the circuit board to be tested is supportable on a lower adapter having a plurality of needles which are engageable with corresponding spring contacts of a constant gauge grid; and wherein an insulating sheet with a variable thickness is disposed between said adapter and said grid, said insulating sheet having a plurality of holes for the passage of said plurality of needles.

14. A machine according to claim 1, wherein the parking area for said press head is located laterally of said test area.

15. A machine according to claim 1, wherein said control terminal is movable from one of said work stations to the other.

16. A machine according to claim 1, wherein a said control terminal is provided at each of said work stations.

* * * * *

UNITED STATES PATENT AND TRADEMARK OFFICE
CERTIFICATE OF CORRECTION

| | | |
|---|---|---|
| PATENT NO. | : 5,614,819 | |
| APPLICATION NO. | : 08/334333 | |
| DATED | : March 25, 1997 | |
| INVENTOR(S) | : Nucci et al. | |

It is certified that error appears in the above-identified patent and that said Letters Patent is hereby corrected as shown below:

On the Title page

Item 12, delete "Nucci" and insert --Nucci et al.--.

Item "[75] Inventor: Fernando Nucci, Arbizzano, Italy"

Should read: "[75] Inventor: Fernando Nucci, Arbizzano, (IT); Fred Bassali, Great Neck, NY (US)".

Signed and Sealed this
First Day of September, 2015

Michelle K. Lee
*Director of the United States Patent and Trademark Office*